June 19, 1962 R. J. WEIDNER 3,040,264

TRANSISTORIZED AMPLIFIER

Filed May 29, 1959 2 Sheets-Sheet 1

INVENTOR
RALPH J. WEIDNER
BY Ralph R Barnard
ATTORNEY

June 19, 1962 R. J. WEIDNER 3,040,264

TRANSISTORIZED AMPLIFIER

Filed May 29, 1959 2 Sheets-Sheet 2

United States Patent Office 3,040,264

Patented June 19, 1962

3,040,264
TRANSISTORIZED AMPLIFIER

Ralph J. Weidner, Endicott, N.Y., assignor to International Business Machines Corporation, New York, N.Y., a corporation of New York Filed May 29, 1959, Ser. No. 816,939
3 Claims. (Cl. 330—25)

This invention generally relates to amplifying devices employing transistors and, more particularly, to transistorized amplifying devices employing two or more stages of amplification with an improved feedback technique.

As is well known to those skilled in the art, the operational parameters of transistors (i.e., current gain and reverse collector leakage current) vary between transistors and with temperature and time to such a large degree that manufacturers specify them in terms of ranges only. In order to provide for these variations, considerable care has to be exercised by the transistor circuit designer. For example, several techniques are utilized to establish the D.C. operating point of a transistor. Each of these methods has advantages and disadvantages with respect to the specific way the changes in transistor operational parameters are taken into account with the passage of time and the variations of ambient temperature. One of these techniques is known as feedback stabilization.

Using this feedback stabilization technique, the voltage drop across a resistor connected to the emitter acts to determine the voltage level of the base of that transistor in a manner so as to aid in initially establishing the D.C. voltage level of that base and, at the same time, modifies its voltage level as required, so that the current passing through the emitter remains the same during the aforementioned operational parameter changes. Following this technique, each stage of a transistorized amplifier contains its own stabilization network. As those skilled in the art will recognize, when each stage of a transistorized amplifier contains its own stabilization network, A.C. coupling must be employed between the stages. Furthermore, as the stages of amplification increase, the number of circuit components increase proportionally because each stage is complete in itself.

It is well known that the reliability of an electronic circuit increases proportionally with a decrease in the number of components utilized. Accordingly, still another technique has been utilized by the prior art whereby the voltage drop across the emitter resistor of the last stage of a transistorized amplifier employing several stages is sampled and applied to the base of the transistor in a first stage, so as to eliminate the requirement that each transistorized stage be separately stabilized. This technique raises many design problems because the voltage fed back not only provides for changes in transistor parameters with temperature and/or time but it also acts to establish the D.C. operating point of the first stage. These two functions are inconsistent in that a high degree of sensitivity of the feedback, for the purpose of correcting for changes in transistor parameters, requires a relatively large voltage drop across the emitter resistor of the last stage, while the D.C. operating point of the first stage requires a relatively low voltage level at its base.

Normally, any attempt to reconcile these two operational parameters represents a compromise between the optimum sensitivity in the compensation for operational transistor parameter changes and the selection of the D.C. operating point of the first transistor. For example, one prior art method is to insert a relatively large resistor within the feedback path. This is unsatisfactory because it reduces the sensitivity of the action of the feedback to correct for parameter changes.

Another method is to insert an additional transistor (connected in a common emitter configuration with a biasing network to establish the operating point) in the feedback circuit for the purpose of amplifying the variations in the voltage drop across the emitter resistance of the last stage. Thus, the sensitivity is increased, and at the same time, a high impedance as viewed from the base of the transistorized first stage is maintained within the feedback circuit.

While the utilization of an additional transistor within the feedback circuit provides improved operation with respect to the other prior art techniques, it has the distinct disadvantage that it requires the additional transistor. This additional transistor does not contribute to the usable forward gain of the amplifier and is in turn subject to modifications of its operational parameters with time and changes in ambient temperature. Furthermore, this additional transistor adds to the number of active components within the amplifier, so as to affect its statistical reliability.

Therefore, it is a primary object of the present invention to provide a new and improved multi-stage transistorized amplifier utilizing a degenerative feedback technique for compensating for changes of transistor parameters.

It is still another object of the present invention to provide a new and improved multi-stage transistorized amplifier employing a degenerative feedback stabilization network between the sampling resistor connected to the transistor of the last stage to the transistor of the first stage in a manner so as to modify the D.C. operating point of the first stage.

It is an additional object of the present invention to provide a new and improved multi-stage transistorized amplifier wherein a voltage source is inserted within a degenerative feedback circuit between a sampling resistor connected within the last stage and the input of the first stage having a magnitude which is substantially equal and a polarity which is opposing to the normal voltage drop across said sampling resistor.

It is another object of the present invention to provide a new and improved multi-stage transistorized amplifier wherein a voltage source is inserted within a degenerative feedback circuit between the emitter of a transistor within the last stage and the base of the transistor within the first stage having a polarity which is opposing to the normal voltage level on the emitter and a magnitude substantially equal thereto.

Other objects of the invention will be pointed out in the following description and claims and illustrated in the accompanying drawings which disclose, by way of examples, the principle of the invention and the best mode which has been contemplated of applying that principle.

Figure 5:
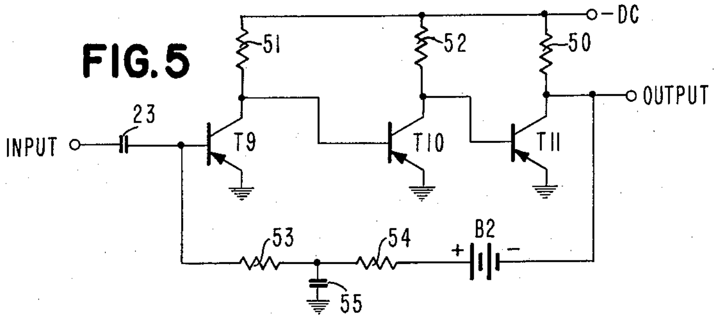
Figure 6:
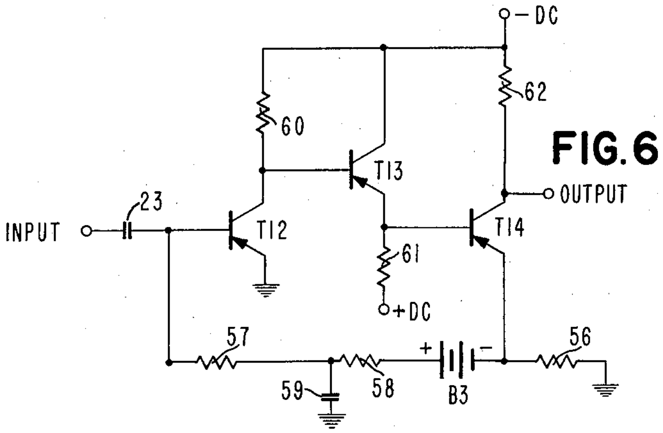

FIG. 5 shows the teachings of the present invention applied to three stages of a transistorized amplifier wherein the feedback is taken from the collector of the last stage rather than the emitter to provide the proper phasing; and FIG. 6 shows the teachings of the present invention applied to three stages of a transistorized amplifier wherein one stage operates in an emitter follower configuration.

Briefly, the teachings of the present invention relate to the use of degenerative feedback from the last stage back to the first stage of a transistorized A.C. amplifier for the purpose of stabilizing the amplifier for changes in collector leakage current and other operational parameters of any of the transistors as a result of temperature changes and the passage of time.

The precise point of patentable novelty involves the insertion of a voltage source within the feedback network having a magnitude substantially equal to the voltage being fed back and a polarity which is opposite to that voltage. As a result of the insertion of this voltage source, the sensitivity of the feedback amplifier to changes in the magnitude of the sampled voltage may be high, while at the same time allowing the biasing voltage level of the input of the transistor within the first stage to be determined independently of the magnitude of the sampled voltage.

Figure 1:
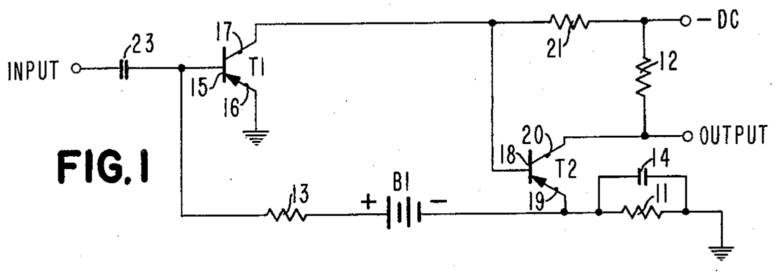
FIG. 1 shows the teachings of the present invention applied to a two stage transistorized amplifier wherein the opposing voltage source is provided by a battery.

Referring to FIG. 1 for example, a two stage transistorized amplifier is shown comprising transistor T1, connected in a common emitter configuration, as the first stage and transistor T2, also connected in a common emitter configuration, as a second and last stage. Transistor T1 has a base 15, emitter 16 and collector 17, and transistor T2 has a base 18, emitter 19 and collector 20. Following known techniques, transistor T2 is established at a D.C. operating point by the proper selection of voltage levels at its base emitter and collector elements. For that purpose, emitter 19 is connected to ground through emitter resistor 11, and collector 20 is connected to a D.C. supply voltage source through collector resistor 12. In addition, base 18 is connected to collector 15 of T1 for the purpose of making T2 responsive to the output of T1. Because of this direct coupling, the initial bias voltage level of base 18 is also affected by the selection of collector resistor 21. Similarly, the D.C. operating point of T1 is determined by the selection of resistor 21 and the voltage level of base 15.

In view of the above, any variation in the operational parameters of T1 (such as the reverse collector leakage current) with temperature and time will result in a change in its D.C. operating point. Moreover, any alteration in the D.C. current gain or the D.C. operating point of T1 will result in a change in the D.C. operating point of T2. Similarly, any variation in the operational parameters of T2 will also change the D.C. operating point thereof. Because of the direct coupling between the stages, the change of operational parameters within the first or early stages will modify the D.C. operating point of the last or latter stages.

Each time the D.C. operating point of T2 is modified, the current flow through emitter resistor 11 is also modified. As suggested hereinabove, to overcome the effects of such changes in operational parameters within multistage transistorized amplifiers, one technique of the prior art has been to sample the current flow in the emitter of the final stage by applying a voltage commensurate with the voltage drop within emitter resistor 11 through the feedback circuit to the input of the first stage in degenerative fashion. Moreover, if it were possible to make the fraction of the voltage drop taken from emitter resistor 11 sufficiently large, a substantially complete degeneration of any changes in biasing voltage levels within the first and second transistorized stages would be possible accompanied by a high degree of stability of the amplifier with both temperature and time. In order that this degeneration be effective only as to D.C. variations and that the transistorized amplifier provide an A.C. gain, a capacitor 14 may be used to bypass emitter resistor 11. The capacitor 14 acts to eliminate voltage variations within the frequency range which it is desired to obtain A.C. amplification from the degenerative feedback. A high degree of degeneration (resulting from using a large fraction of the voltage drop across emitter resistor 11) for D.C. variations is not possible as a practical matter because the voltage level, which must be applied to base 18 and emitter 19 of T2 to make the initial selection of its D.C. operating point, is inconsistent with the voltage level which must be applied to base 15 and emitter 16 of T1.

One technique of the prior art to provide for this voltage differential between the sampled voltage (voltage level of emitter 19 of T2) and the voltage level of base 15 of T1 was to insert an impedance therebetween. However, this impedance has the effect of decreasing the fraction of the feedback voltage which is being fed back and acts to limit the sensitivity of the D.C. compensation being obtained from the utilization of the degenerative feedback.

Instead of inserting a large impedance within the feedback circuit, the present invention teaches the placing of a voltage cell B1 within the feedback circuit having a magnitude which is substantially equal to the voltage drop across emitter resistor 11 during the initial selection of the D.C. operating point of T2 and a polarity which opposes that voltage drop. Accordingly, the terminal of battery B1, remote from emitter 19, is initially at ground level, and resistor 13 connected in the feedback circuit may be independently selected for the purpose of determining the most desirable biasing voltage level of the base of transistor T1. On the occurrence of any changes in the operation parameters of T1 or T2, which modify the voltage drop across emitter resistor 11, the feedback network will have optimum sensitivity to re-establish the D.C. operating point of transistor T2 and the initial voltage drop across voltage resistor 11. Any small variations of the voltage drop across resistor 11 will be applied to the base of T1 without being diminished by the large impedance utilized in the prior art.

As those skilled in the art will recognize, the D.C. current gain of a degenerative feedback amplifier may be represented by the following equation:

$$AF_{dc}=\left(\frac{1}{1+\gamma A_{dc}}\right)A_{dc} \qquad (1)$$

where:

$A_{dc}$ is the open loop D.C. gain of the multi-stage amplifier;

$AF_{dc}$ is the closed loop D.C. gain of the same multistage amplifier with the feedback connected; and $\gamma$ represents the fraction of the D.C. output of the last stage which is fed back to the input stage in a degenerative fashion.

A better D.C. transistor operational parameter compensation can be obtained as the right hand side of Equation 1 decreases toward 1. The teachings of the present invention allow the fraction $\gamma$ to be higher without regard for the bias voltage levels of the transistor of the first stage. Moreover, the greater the open loop $A_{dc}$, the closer the right hand side of Equation 1 approaches 1. The present invention allows the magnitude of $A_{dc}$ to be as large as desired without limiting the magnitude of $\gamma$ which may be obtained.

Since it is desired that this degenerative feedback be effective for changes in the D.C. operating point of T2 only, the bypass capacitor 14 is utilized to prevent this degenerative action for A.C. signals, which it is desired to amplify. It is an important aspect of the present invention that the improved sensitivity provided by the insertion of B1 in the feedback circuit is equally as great for both an increase of the voltage drop across resistor 11 as for a decrease in that voltage drop.

It is an additional feature of the present invention that this increased sensitivity in the feedback compensation does not require the insertion of an active element such as a transistor, which is in turn subject to changes in operational parameters with time and temperature. These changes in operational parameters of a trnsistor within the feedback circuit will result in undesirable variations in the compensation action. Furthermore, any time the number of active components of an amplifier circuit is increased, the statistical reliability of the amplifier decreases. This is particularly undesirable when the increased active component count does not result in a favorable increase in gain.

It is an important aspect of the present invention that direct coupling may be used between the transistor of each stage while at the same time providing adequate compensation for variations in the operational parameters of the transistors. A capacitor 23 provides a decoupling action for the transistorized amplifier of FIG. 1 with respect to its input.

Figure 2:
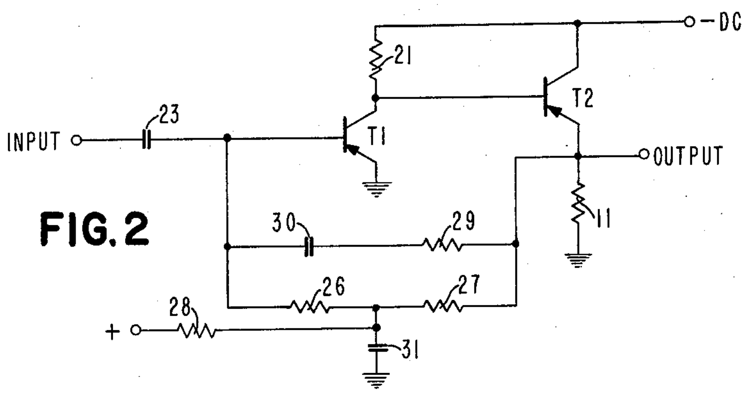
FIG. 2 shows the teachings of the present invention applied to two stages of a transistorized amplifier wherein the opposing voltage source is provided by the supply voltage and the feedback circuit contains frequency responsive parameters.

FIG. 2 is similar to FIG. 1 and identical components have the same identification numerals. One distinction from FIG. 1 involves the utilization of a voltage source from the conventional power supply instead of cell B1 within the feedback circuit. Resistors 26 and 27 comprise the D.C. feedback path, and the opposing voltage source is applied to their common junction through resistor 28. As in FIG. 1, this voltage source is selected to have a polarity which opposes the voltage drop across emitter resistor 11 and has sufficient magnitude to apply a voltage through resistors 27 and 28, which is equal to the voltage drop across emitter resistor 11 under design conditions. As shown, the feedback circuit is made frequency responsive by the addition of resistor 29 and capacitors 30 and 31.

For low frequency applications (audio amplifiers), the size of a capacitor, which would be required for bypassing emitter resistor 11 in the manner shown by capacitor 14 in FIG. 1, would be prohibitive. As an alternative, a capacitor 31 may be utilized to ground the junction of resistors 26 and 27 to provide the same function and, at the same time, requires a smaller capacitor because of the impedance contribution of resistor 27. Capacitor 30 and resistor 29 alter the degenerative action for A.C. signals at the higher frequencies.

Figure 3:
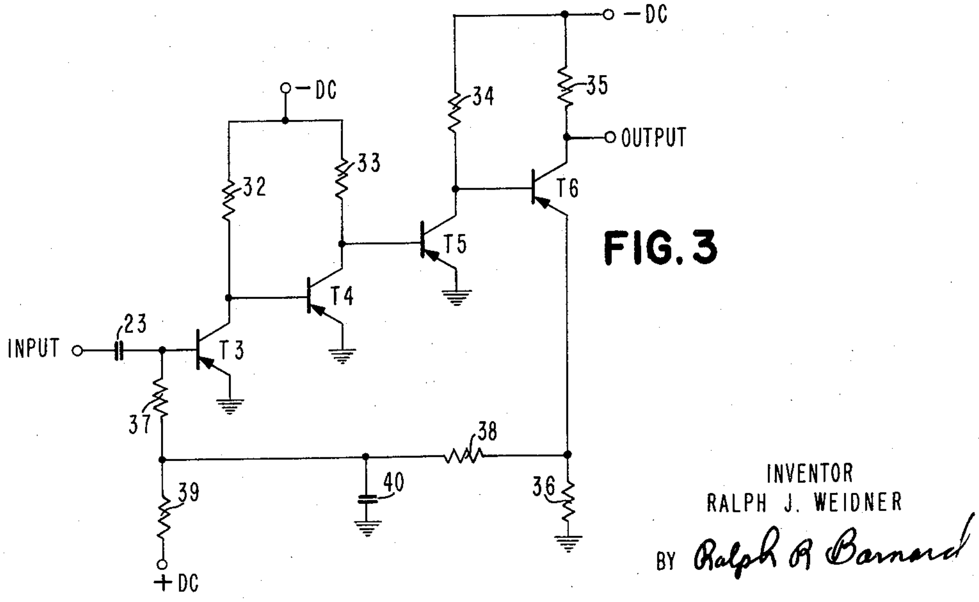
FIG. 3 shows the teachings of the present invention applied to four stages of a transistorized amplifier wherein the opposing voltage source is provided by the supply voltage.

The technique of the present invention may be applied to two or more stages, providing each of the transistors within the forward path of the amplifier is direct coupled. For example, FIG. 3 shows four stages being utilized. Each of the transistors T3, T4, T5 and T6 is shown in a common emitter configuration. Direct coupling is employed between transistors. Collector resistors 32, 33, 34 and 35 provide a voltage biasing function to establish the D.C. operating point of the stages in the same manner described above with regard to FIG. 1. It should be noted, however, that the voltage applied to collector resistors 32 and 33 should be at a lower level than those applied to resistors 34 and 35 because of the different D.C. operating points required for each of the stages. Emitter resistor 36 provides the compensating degenerative feedback voltage in the same manner as set forth above. Resistors 37 and 38 provide a D.C. feedback path, and an opposing voltage source is applied through resistor 39 to the common junction thereof. Capacitor 40 connected to the common junction of resistors 37 and 38 renders the feedback circuit frequency responsive so that an A.C. gain is obtained for the desired frequency range.

It is a significant feature of the present invention that degenerative feedback including the opposing voltage source may be utilized between the output stage and the initial stage regardless of the number of stages, providing that each stage is directly coupled.

Figure 4:
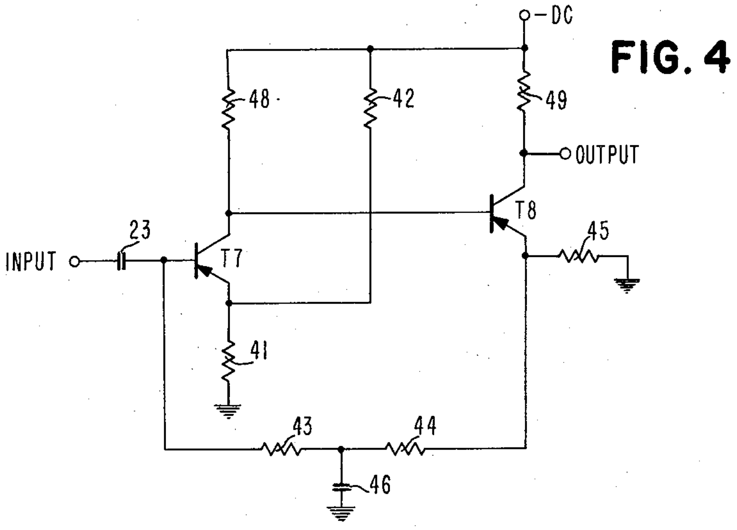
FIG. 4 shows the teachings of the present invention applied to two stages of a transistorized amplifier wherein the opposing voltage source in the feedback network is obtained from the same supply voltage source providing the collector biasing.

Referring now to FIG. 4, there is shown a two stage transistorized amplifier utilizing the teachings of the present invention. It is similar to that shown in FIG. 3 except that the opposing voltage source within the feedback circuit is inserted in the emitter circuit of the transistor T7 of the first stage. A resistor 41 is placed into the emitter circuit of T7 so as to receive this opposing voltage. As a practical matter, the opposing voltage may be placed anywhere within the feedback circuit which includes the base emitter circuit of the transistor of the first stage. The selection of the magnitude of resistors 41 and 42 connected between the D.C. supply voltage and ground is determined by the magnitude of the D.C. voltage supply and the voltage which must be applied to an emitter of T7 to assure that the opposing voltage within the feedback circuit (including resistors 43 and 44) is of approximately equal magnitude to the normal voltage drop across emitter resistor 45 of T8 during its initial design condition. Capacitor 46 grounds the common terminal of resistors 43 and 44 and renders the feedback circuit frequency responsive to provide the desired A.C. gain during a selected frequency range. Collector resistors 48 and 49 function in the usual manner to provide the initial biasing levels for T7 and T8, respectively.

FIG. 5 illustrates that the teachings of the present invention may be applied to multi-stage transistorized amplifiers having an odd number of stages. Because of the requirement that the feedback voltage be degenerative, the sampled voltage must be taken from the collector of the last stages across collector resistor 50 instead of an emitter resistor as shown hereinabove. Similarly, the magnitude of opposing voltage source B2 must be of opposite polarity and approximately equal in magnitude to the voltage drop across collector resistor 50 under initial biasing conditions for transistor T11. Collector resistors 51 and 52 function in the usual manner to determine the initial D.C. operating point of T9 and T10, respectively. Resistors 53 and 54 provide a D.C. degenerative feedback path, and capacitor 55 renders the feedback circuit frequency responsive in the same manner as similar components already described.

Referring to FIG. 6, there is shown a three stage transistorized amplifier utilizing the teachings of the present invention with one stage including transistor T13 operating as an emitter follower. Since T13, operating as an emitter follower, does not invert the variations in voltage level in its input, degenerative feedback can be obtained by applying the voltage drop across emitter resistor 56 of T14 back to the base of T12. Cell B3 provides the opposing voltage to provide a compensating action for operational parameter changes in accordance with the teachings of the present invention. Resistors 57 and 58 provide the D.C. feedback path, and capacitor 59, which grounds the common terminal thereof, makes the feedback frequency responsive. Collector resistor 60 connected to the D.C. supply voltage aids in establishing the initial operating condition of transistor T12. The emitter resistor 61 aids in establishing the initial operating condition of T13 and collector resistor 62 along with emitter resistor 56 aids in selecting the initial operating condition of T14.

While FIGURES 1–6 show some of the alternate embodiments of the present invention, it should be clearly understood that these are merely representative and the fundamental teachings of the present invention have wide application to transistorized amplifiers wherein the variation of operational parameters is a matter of concern.

In applying the teachings of the present invention, care must be exercised to assure that the feedback is degenerative in nature and the circuit components selected with this requirement in mind. While PNP junction transistors have been shown in the drawings, it should be clear that NPN junction transistors could have been used provided that the biasing voltages are properly reversed. Although junction transistors have been shown, point contact transistors might well be utilized if their phase shift and amplification characteristics are properly considered in the design of the amplifier.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A multi-stage transistorized A.C. amplifier comprising an input terminal and output terminal, a plurality of amplifier stages, each comprising a transistor type device, one of said transistors connected to said input terminal, another of said transistors connected to said output terminal, each of said stages being D.C. coupled to the adjacent stage, a sampling resistor connected in the output stage in a manner such that the current passing therethrough varies in accordance with changes of D.C. transistor operational parameters within any of said stages, a degenerative feedback circuit connected to sample the voltage drop across said sampling resistor and apply that voltage to the input of said transistor of said first stage, a means connected within said feedback circuit to develop a voltage therein substantially equal to the voltage drop across said sampling resistor under desired operating conditions, said voltage source having a polarity so as to oppose the voltage drop across said sampling resistor.

2. The multi-stage transistorized A.C. amplifier of claim 1 wherein said feedback circuit includes frequency responsive elements so that the degenerative action does not affect the A.C. gain over a selected frequency range.

3. The multi-stage transistorized A.C. amplifier of claim 1 wherein said means connected within said feedback circuit to develop a voltage therein comprises a properly oriented voltage cell.

References Cited in the file of this patent

UNITED STATES PATENTS

| | | |
|---|---|---|
| 2,714,702 | Shockley | Aug. 2, 1955 |
| 2,847,519 | Aronson | Aug. 12, 1958 |
| 2,874,236 | Sikorra | Feb. 17, 1959 |
| 2,881,269 | Hanel | Apr. 7, 1959 |

OTHER REFERENCES

Murray: "Transistor Bias Stabilization," Electronic and Radio Engineer, May 1957, pages 161–165 (page 161 only relied on).

Schuster: "D–C Transistor Amplifier For High Impedance Input," Electronics, Engineering Editions, Feb. 28, 1958, pages 64, 65.

Anzalone: "A High Impedance Transistor Circuit," Electronic Design, June 1, 1957, pages 38–41.